(12) United States Patent
Tsen et al.

(10) Patent No.: US 8,229,588 B2
(45) Date of Patent: Jul. 24, 2012

(54) METHOD AND SYSTEM FOR TUNING ADVANCED PROCESS CONTROL PARAMETERS

(75) Inventors: Andy Tsen, Chung-Ho (TW); Chih-Wei Hsu, Chuang-Hua (TW); Ming-Yeon Hung, Hsinchu (TW); Ming-Yu Fan, Hsinchu County (TW); Wang Jo Fei, Hsinchu (TW); Jong-I Mou, Hsinpu Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 265 days.

(21) Appl. No.: 12/396,996

(22) Filed: Mar. 3, 2009

(65) Prior Publication Data

US 2010/0228370 A1    Sep. 9, 2010

(51) Int. Cl.
*G06F 19/00* (2011.01)

(52) U.S. Cl. ......................................... 700/121; 700/103

(58) Field of Classification Search .................. 700/103, 700/117, 121
See application file for complete search history.

(56) References Cited

U.S. PATENT DOCUMENTS

| | | | | |
|---|---|---|---|---|
| 5,896,294 A * | 4/1999 | Chow et al. | ...................... | 700/121 |
| 6,556,884 B1 * | 4/2003 | Miller et al. | ..................... | 700/121 |
| 6,625,512 B1 * | 9/2003 | Goodwin | ........................ | 700/121 |
| 6,952,656 B1 * | 10/2005 | Cordova et al. | ................ | 702/117 |
| 6,961,636 B1 * | 11/2005 | Chong et al. | ..................... | 700/121 |
| 6,988,017 B2 * | 1/2006 | Pasadyn et al. | ................ | 700/121 |
| 7,008,300 B1 * | 3/2006 | Molnar | ............................. | 451/41 |
| 7,146,237 B2 * | 12/2006 | Lev-Ami et al. | ............... | 700/121 |
| 7,158,851 B2 * | 1/2007 | Funk | ................................ | 700/121 |
| 7,197,370 B1 * | 3/2007 | Ryskoski | ........................ | 700/108 |
| 7,209,798 B2 * | 4/2007 | Yamashita et al. | ............. | 700/121 |
| 7,212,878 B2 * | 5/2007 | Funk et al | ........................ | 700/121 |
| 7,220,990 B2 * | 5/2007 | Aghababazadeh et al. | ...... | 257/48 |
| 7,221,990 B2 * | 5/2007 | Paik | ................................ | 700/109 |
| 7,291,285 B2 | 11/2007 | Behm et al. | | |
| 7,328,418 B2 * | 2/2008 | Yamashita et al. | ............. | 700/121 |
| 7,363,099 B2 * | 4/2008 | Smith et al. | ..................... | 700/121 |
| 7,451,011 B2 * | 11/2008 | Funk et al. | ...................... | 700/121 |
| 7,477,960 B2 * | 1/2009 | Willis et al. | ..................... | 700/121 |
| 7,831,324 B2 * | 11/2010 | Stirton et al. | .................. | 700/103 |
| 7,869,894 B2 * | 1/2011 | Stirton et al. | .................. | 700/109 |
| 7,877,161 B2 * | 1/2011 | Tomoyasu et al. | ............. | 700/121 |
| 7,899,570 B2 * | 3/2011 | Ortleb et al. | .................... | 700/121 |
| 2004/0044431 A1 * | 3/2004 | Pellegrini et al. | ............. | 700/121 |
| 2004/0267399 A1 * | 12/2004 | Funk | ................................ | 700/121 |
| 2005/0228529 A1 * | 10/2005 | Lev-Ami et al. | ............... | 700/121 |
| 2005/0240895 A1 * | 10/2005 | Smith et al. | ...................... | 716/19 |
| 2006/0015206 A1 * | 1/2006 | Funk et al. | ...................... | 700/121 |
| 2006/0047356 A1 * | 3/2006 | Funk et al. | ...................... | 700/121 |
| 2006/0064193 A1 * | 3/2006 | Yamashita et al. | ............. | 700/121 |
| 2006/0195218 A1 * | 8/2006 | Yamashita et al. | ............. | 700/121 |
| 2007/0078556 A1 * | 4/2007 | Stirton et al. | .................. | 700/108 |
| 2008/0103618 A1 * | 5/2008 | Stirton et al. | .................. | 700/108 |
| 2010/0036518 A1 * | 2/2010 | Funk et al. | ...................... | 700/121 |

* cited by examiner

*Primary Examiner* — Albert Decady
*Assistant Examiner* — Anthony Whittington
(74) *Attorney, Agent, or Firm* — Haynes and Boone, LLP (57) ABSTRACT

A method of advanced process control (APC) for semiconductor fabrication is provided. The method includes providing a present wafer to be processed by a semiconductor processing tool, providing first data of previous wafers that have been processed by the semiconductor processing tool, decoupling noise from the first data to generate second data, evaluating an APC performance based on proximity of the second data to a target data, determining a control parameter based on the APC performance, and controlling the semiconductor processing tool with the control parameter to process the present wafer.

17 Claims, 11 Drawing Sheets

METHOD AND SYSTEM FOR TUNING ADVANCED PROCESS CONTROL PARAMETERS

BACKGROUND

The present disclosure relates generally to semiconductor fabrication, and more particularly, to semiconductor fabrication process control.

As performance requirements and throughput demands increase, semiconductor fabrication process control has become even more crucial. However, as process geometries decrease, such as from 65 to 45 nanometer and beyond, it may be challenging to keep process variations at acceptable levels. As such, the processes may suffer from losses in tool productivity, increased operator interaction, yield loss, and higher rework rates, all possibly leading to higher costs. Advanced Process Control (APC), which may consist of models and feedback systems among other process control techniques, has been widely used to help alleviate some of the variations. However sufficient APC methods are lacking, especially for controlling and tuning parameters that are affected by multiple process steps. In some applications, noise signals from various aspects of semiconductor fabrication can influence and disturb the APC design and implementation. The noise signals may come from previous stages of fabrication, present operating conditions, and APC actions, themselves. Consequently, although existing APC techniques have been generally adequate for their intended purposes, they have not been entirely satisfactory in all respects.

BRIEF DESCRIPTION OF THE DRAWINGS

One of the broader forms of an embodiment of the invention involves a method for advanced process control for semiconductor fabrication. The method includes providing a present wafer to be processed by a semiconductor processing tool; providing first data of previous wafers that have been processed by the semiconductor processing tool; decoupling noise from the first data to generate second data; evaluating an APC performance based on proximity of the second data to a target data; determining a control parameter based on the APC performance; and controlling the semiconductor processing tool with the control parameter to process the present wafer.

Another one of the broader forms of an embodiment of the invention involves a method for advanced process control of an etching process. The method includes providing data of previous wafers that have undergone the etching process; removing an APC impact by a first modification of the data, the first modification isolating a chamber effect on the data, the chamber effect including a condition of an etching tool that can influence the etching process; removing a pre-stage effect by a second modification of the data, the pre-stage effect including an after-development-inspection process; determining an APC performance based on proximity of the modified data to a target data, the modified data including the first and second modifications of the data; determining a control parameter for the etching process based the APC performance; and controlling the etching process with the control parameter to process a present wafer.

Yet another one of the broader forms of an embodiment of the invention involves an advanced process control system. The system includes memory operable to store first data of previous wafers that have been processed by the semiconductor processing tool; and a controller operable to control the semiconductor processing tool based on instructions that: decouple noise from the first data to generate a second data; evaluate an APC performance based on proximity of the second data to a target data; determine a control parameter based on the APC performance; and control the semiconductor processing tool with the control parameter to process a present wafer.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1 is a block diagram illustrating a system in which various embodiments disclosed herein are implemented in;

DETAILED DESCRIPTION

The present disclosure relates generally to the fabrication of semiconductor devices, and more particularly, to process control of the fabrication of semiconductor devices. It is understood, however, that specific embodiments are provided as examples to teach the broader inventive concept, and one of ordinary skill in the art can easily apply the teaching of the present disclosure to other methods or apparatus. Also, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings.

Figure 1:
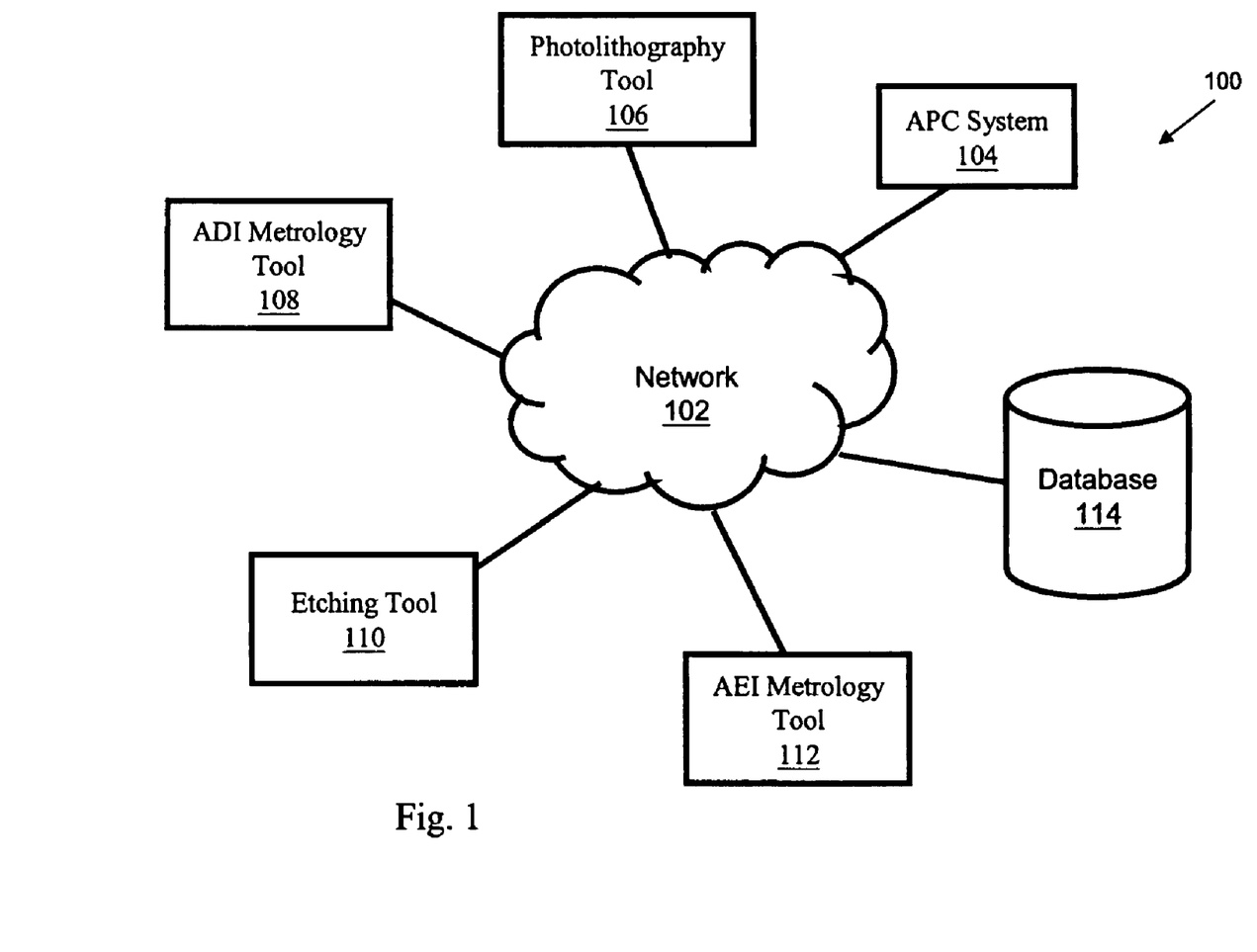

Referring to FIG. 1, illustrated is a semiconductor fabrication system 100 that embodies various aspects of the present disclosure. The system 100 comprises a plurality of entities that are connected by a communications network 102. The network 102 may be a single network or may be a variety of different networks, such as an intranet and the Internet, and may include both wired and wireless communication channels. Each entity may interact with other entities and may provide services to and/or receive services from the other entities. In the present embodiment, the entities include an Advanced Process Control (APC) system 104, an photolithography tool 106, an after-development-inspection (ADI) metrology tool 108, an etching tool 110, an after-etching-inspection (AEI) metrology tool 112, and a database 114. It is understood that the system 100 may further comprise various other processing tools (e.g., deposition tools, chemical mechanical polishing (CMP) tools, furnaces, etc.), metrology equipment, and controllers that perform other stages of semiconductor fabrication but are not illustrated for the sake of simplicity and clarity.

The photolithography tool 106 is a device of a type known in the art. The photolithography tool 106 is used to pattern a photosensitive layer (e.g., photoresist) with various features that form an integrated circuit. In an embodiment, the photolithography tool 106 includes an immersion lithography tool. In other embodiments, the photolithography tool 106 may be implemented or replaced by other proper methods such as maskless photolithography, electron-beam writing, ion-beam writing, and molecular imprint. The ADI metrology tool 106 is a device of a type known in the art. The ADI metrology tool 108 measures critical dimensions (CD) and profiles of the patterned features formed on the photosensitive layer. The CD information may be stored in the database 114 and/or provided to the APC system 104.

The etching tool 110 is a device of a type known in the art, and includes one or more etching chambers that are not separately illustrated. A semiconductor wafer is placed in the etching chamber, and then is subjected to an etching process. The AEI metrology tool 112 is a device of a type known in the art. The AEI metrology tool 112 inspects and checks for defects, contamination, and CD following the etching process. In an embodiment, the AEI metrology tool 112 includes an optical spectrum (e.g., optical critical dimension or OCD) metrology tool to measure CD and/or profiles of etched features. The CD information may be stored in the database 114 and/or provided to the APC system 104.

Aspects of the present disclosure may be implemented within the APC system 104 to analyze information either from the ADI metrology tool 108 or the AEI metrology tool 112 or the database 114 or other proper equipment in the system 100. The APC system 104 may comprise a computer that can be a conventional, commercially-available computer, or any other suitable computer hardware. The hardware of the APC system 104 includes a processor and a memory. The memory stores a computer program that is executed by the processor, and that causes the computer to control the photolithography tool 106 and etching tool 110. The computer is operable to perform actions including manipulating information (including manipulating information using a model), receiving information, storing information, and transferring information. The information may include, for example, commands, process parameters such as those parameters used in the process recipe, measurement data, process data such as the history of processes ran including specific tool or tool sector used and process parameters used, and/or equipment status. In an embodiment, the computer may include multiple computers. In an embodiment, the computer may include equipment or code embedded in a process tool, such as, for example the photolithography tool 106 or the etching tool 110. The computer may further include one or multiple user interfaces.

In regard to control of the etching tool 110, the APC system 104 obtains information representing characteristics of the etching process carried out by the etching tool 110. These process characteristics are discussed in detail below. For the etching process carried out by the etching tool 110, the process characteristics would typically include characteristics such as temperature, pressure, chemicals, theoretical trim rate, trim time, and so forth. The process characteristics are supplied to single-input single-output (SISO) or a multi-input multiple-output (MIMO) automatic process control module of the APC system 104, which controls the etching tool 110.

Figure 2:
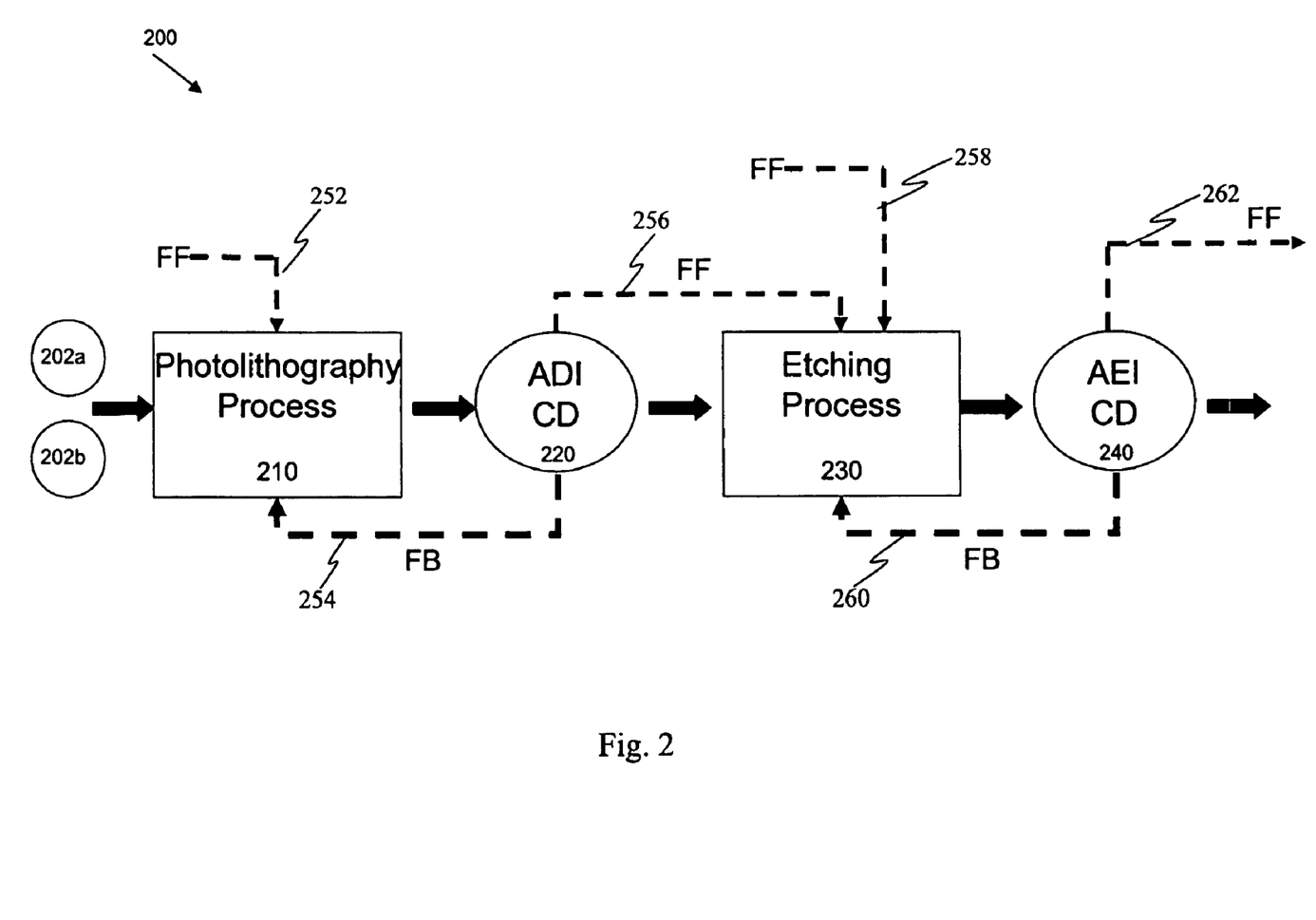
FIG. 2 is a block diagram illustrating part of a semiconductor fabrication process flow according to various aspects of the present disclosure.

Referring to FIG. 2, illustrated is a block diagram of a semiconductor fabrication process flow 200. The process flow 200 includes a material process flow, illustrated as solid lines, and an information flow, illustrated as dashed lines. The material process flow includes processes for fabricating a semiconductor substrate, such as, for example, a wafer. A first wafer 202a and a second wafer 202b are illustrated, however, multiple wafers are likely to be processed grouped in lots, as such, the reference to a wafer in the singular in the present disclosure does not by necessity limit the disclosure to a single wafer, but may be illustrative of a lot including a plurality of wafers, a plurality of lots, or any such grouping of material. The process flow 200 illustrates four processes, a photolithography process 210, an ADI CD metrology process 220, an etching process 230, and an AEI CD metrology process 240. The processes 210-240 may be performed by the tools and controlled by the APC system described above with reference to FIG. 1.

In the present embodiment, the wafers 202a, 202b include various material layers (e.g., polysilicon layer, dielectric layer, etc.) formed thereon, and are ready for patterning by the photolithography process 210. The APC system may control the photolithography process 210 by utilizing feed-forward information 252 from previous stages (e.g., deposition process, CMP, topography analysis) or operating conditions that may effect the photolithography process 210 and feed-back information 254 from recent photolithography performance determined by the ADI CD metrology process 220. Accordingly, a photosensitive layer is formed on the wafers 202a, 202b, and patterned with various features. The wafers 202a, 202b are inspected in the ADI CD metrology process 220 to measure CD and profiles of the patterned photosensitive layer. The CD and profile information from the ADI CD metrology process 220 is fed forward 256 to control the etching process 230. Additionally, the APC system may also utilize feed-forward information 258 from previous stages or operating conditions that may effect the etching process 230 and feed-back information 260 from recent etching performance determined by the AEI CD metrology process 240.

In an embodiment, the etching process 230 includes multiple chambers and is operable to perform an etch process. The wafers 202a, 202b are then inspected by the AEI CD metrology process to check for defects/contamination and to measure CD of the etched layers underlying the patterned photoresist. In an embodiment, the measurement is performed by the etching tool. In an alternative embodiment, the measurement is done by a separate tool. The wafers 202a, 202 are transported to other tools for further processing. Additionally, the CD information of the etched material layers may be fed-forward 262 to control a subsequent process such as an implantation process (not shown). The APC system is operable to monitor and affect the conditions of the process flow 200, and execute memory instructions consistent with the methods discussed in greater detail below.

It has been observed that noise signals from different previous stages and chamber conditions of the present stage can disturb the design and implementation of the APC system. For example, the APC system sometimes lacked precise information about the controller's performance and did not have a method to automatically tune a process parameter such as trim rate parameters of the etching process. In the past, the APC controller was designed from a design of engineering (DOE) methodology and the process parameter was tuned by experience from an engineer. The DOE methodology involves performing experiments with various process conditions to determine and evaluate parameters and characteristics of a semiconductor process. In an example, the DOE results show a trim rate of 0.35 which is implemented in a poly-etching APC controller. However, over time, the trim rate changes due to various factors, and thus the trim rate needs to be tuned, adjusted, or reset to account for these factors. The engineer would typically tune the trim rate parameters to reduce an output deviation and make the distribution between the input (e.g., ADI CD) and output (e.g., AEI CD) independent which can be challenging. In some critical stages, the noise from the previous stages and APC actions (e.g., trim time vibration) have been found to contribute over 50% deviation which would make the chamber effects far from DOE environment, and thus would provide inaccurate control. Accordingly, the methods discussed below provide a technique to quantify the APC performance of a semiconductor process to achieve ideal APC design and implementation. Thus, the methods discussed below can be used to automatically tune the APC parameters for real-time control which eliminates any possible bias judgments of the engineer for tuning the APC parameters.

Figure 3:
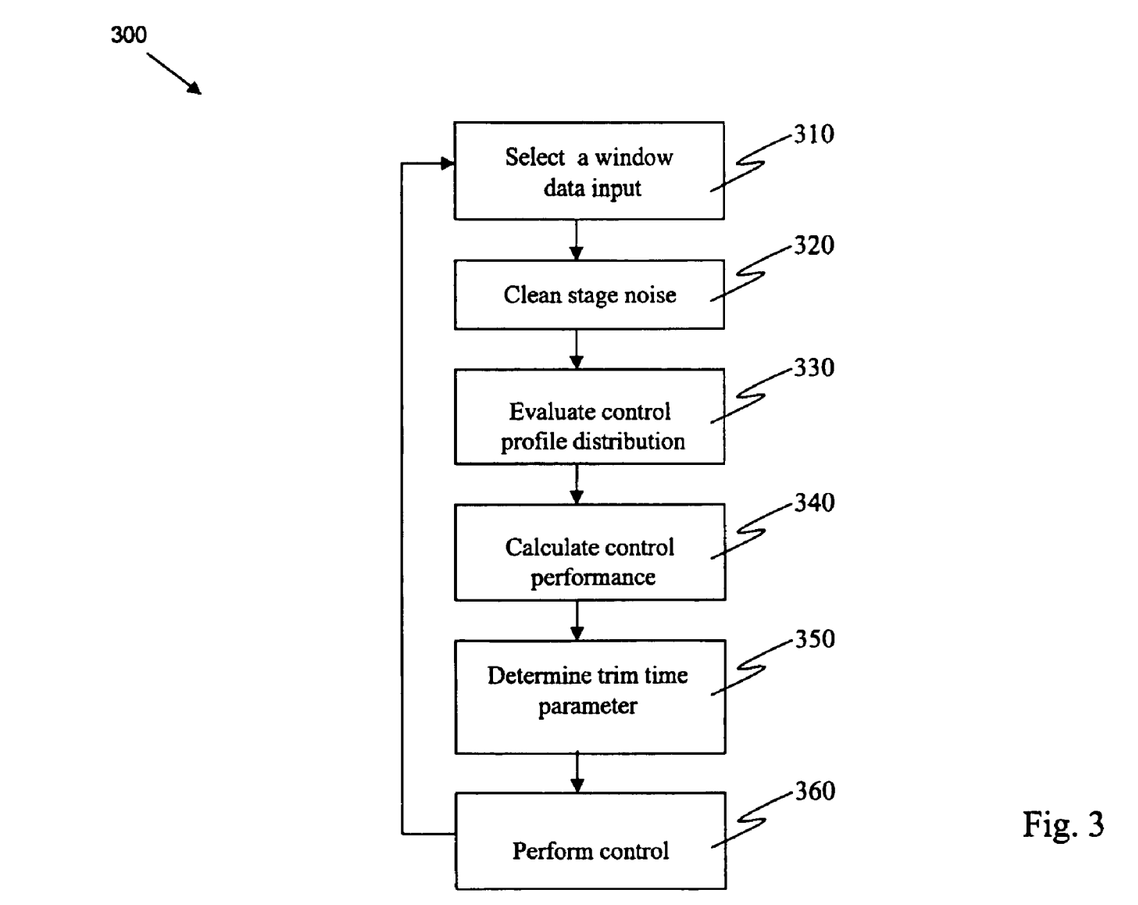
FIG. 3 is a flowchart illustrating an embodiment of a method of tuning an advanced process control (APC) parameter according to various aspects of the present disclosure.

Referring to FIG. 3, illustrated is an embodiment of a method 300 for advanced process control of a semiconductor process. For clarity and convenience, it will be assumed for purposes of the present discussion that an etching process carried out in the etching tool serves to etch a gate structure into a layer of polysilicon at the top of wafer, and that one of the parameters that is automatically tuned is related to a trim rate (referred to as TR) of the etching process. The process parameters and characteristics will, of course, be selected with a view to achieving a target trimmed line width. The noise of the etching process can be divided into three components. First, conditions of etch chamber (referred to as chamber effects) can influence the etching process. For example, contaminants may build up in the etch chamber over time, and can progressively change the CD of the gate width that is achieved under a given set of control conditions. Second, previous stages (referred to as pre-stage effects) can influence the etching process. For example, performance of the photolithography process to pattern features can change over time. Third, APC actions (referred to as APC effect) such as trim time to achieve the desired trimmed line width is dependent on the trim rate parameter and conditions of the etch chamber. As such, trim time vibration may occur over time.

The method 300 begins with block 310 in which a window of wafer data input is selected. One or more lots of wafers have undergone the etching process and data of those wafers have been stored in a database. The wafer data includes process parameters and results such as trim rates, trim times, chamber conditions, ADI CD metrology (referred to as ADI), AEI CD metrology (referred to as AEI), actual trimmed line widths (ADI-AEI), target trimmed line widths (ADI-target AEI), and other proper information. The window of wafer data input may be selected to evaluate the etching process and tune the APC parameters. It is understood that the window may include any number of wafers. Over time, the window may be moved to evaluate more recent process parameters and results.

In an embodiment, an exponentially weighed moving average (EWMA) controller is one example of an APC algorithm of the etching process. For example, it has been observed that the etching process may be described in equations discussed below. Equation (1) represents a model equation for the etching process and can be expressed as:

$$y = a \times x + b = R_{trim} \times T_{trim} + \text{model\_}b \tag{1}$$

Where y denotes a trimmed line width, X denotes a trim time ($T_{trim}$), a denotes a trim rate ($R_{trim}$) (also referred to as TR), and b denotes a constant (referred to as model_b). The trimmed line width y is equal to a difference between ADI and AEI (also referred to as CD Bias). The ADI represents a line width (CD) measured prior to the etching process and the AEI represents the line width (CD) measured after the etching process, and the difference between these two values represents the trimmed line width of the etching process. The parameter b (model_b) will be updated over time to provide more precise information regarding the performance of the etching process (e.g., trim rate) as discussed below.

Equation (2) represents a control equation of the etching process and can be expressed as:

$$u = \frac{T - b}{a} \tag{2}$$

Where u denotes a trim time that is applied to the etching process by the APC system to control processing of a wafer, and T denotes a target trimmed line width to be achieved by the etching process. The target T represents a desired amount of the line width to be trimmed and is equal to ADI CD minus Target AEI CD (ADI-target AEI). The amount to be trimmed is equal to the difference between the line width measured prior to the etching process (ADI CD) and a desired/target line width that is to be formed after the etching process (Target AEI CD).

Equation (3) represents an EWMA equation and can be expressed as:

$$b_{n+1} = \omega \times (y_n - a \times x_n) + (1 - \omega) \times b_n \tag{3}$$

Where EWMA is used to update the parameter b for the etching process. The EWMA equation averages data in a manner that gives less and less weight to data as it is further removed in time. In equation (3), $b_{n+1}$ denotes the next parameter, $b_n$ denotes the previous parameter, and ω is between 0 and 1. Accordingly, the APC system is capable of real-time control of the etching process depicted in equations (1)-(3) by updating the parameter b (model_b), tuning various process parameters such as trim rate a, and determining the trim time u required to achieve the target trimmed line width T. The process parameters can be automatically tuned to accurately reflect the current etching process by quantifying the performance of the APC system on the etching process.

The method 300 continues with block 320 in which noise is cleaned from a stage. In order to quantify the APC performance, the effects of the chamber conditions (chamber effects) and pre-stage measurements (pre-stage effects) are isolated from the present stage such as an etching process. The technique to isolate the chamber and pre-stage effects and remove them from the results of the etching process may be referred to decoupling noise of the stage. The chamber effects are combined with the APC actions to achieve different process results. Accordingly, one may decouple the process results with the information of all the APC actions. That is, the APC effect can be removed from the process results to obtain the chamber effects of the etching process. An average trim time $T_{r0}$ of n wafers that have been processed is determined and can be expressed as equation (4):

$$T_{r0} = \frac{\sum_{i=1}^{n} T_{trim,i}}{n} \qquad (4)$$

This will decouple the process results by a constant trim time setting. The process to compare the original trim rate and a modified trim rate is shown below.

A clean trim rate without noise $R_{trim}'$ is retrieved, for example, by different trim time and can be expressed as equation (5):

$$R_{trim}' = \frac{\text{model\_b}_n - \text{model\_b}_{n-1}}{\omega_{EWMA} \times T_{trim}} + R_{trim} \qquad (5)$$

An adjusted CD Bias y' (also referred to as CD Bias'= (ADI−AEI')) can be evaluated by equation (6):

$$y' = y + (T_{r0} - T_{trim}) \times R_{trim}' = \text{ADI} - \text{AEI}' \qquad (6)$$

The adjusted CD Bias y' is evaluated after decoupling the APC impact on the process results where y is the original CD Bias illustrated in equation (1).

A pre-stage effect (e.g., ADI CD measurement) is then removed. This can be expressed as equation (7):

$$y^{\#} = \text{CDBias}^{\#} = (T_{r0} - T_{trim}) \times R_{trim}' + (1 - \in) \times \text{ADI} - \text{AEI} + \in \times \text{ADI}_{mean} \qquad (7)$$

Where $\in$ denotes a slope of a correlation model of the CD Bias and pre-stage measurement (ADI CD). The pre-stage ADI CD measurement effects are eliminated with the slope $\in$.

Figure 4:
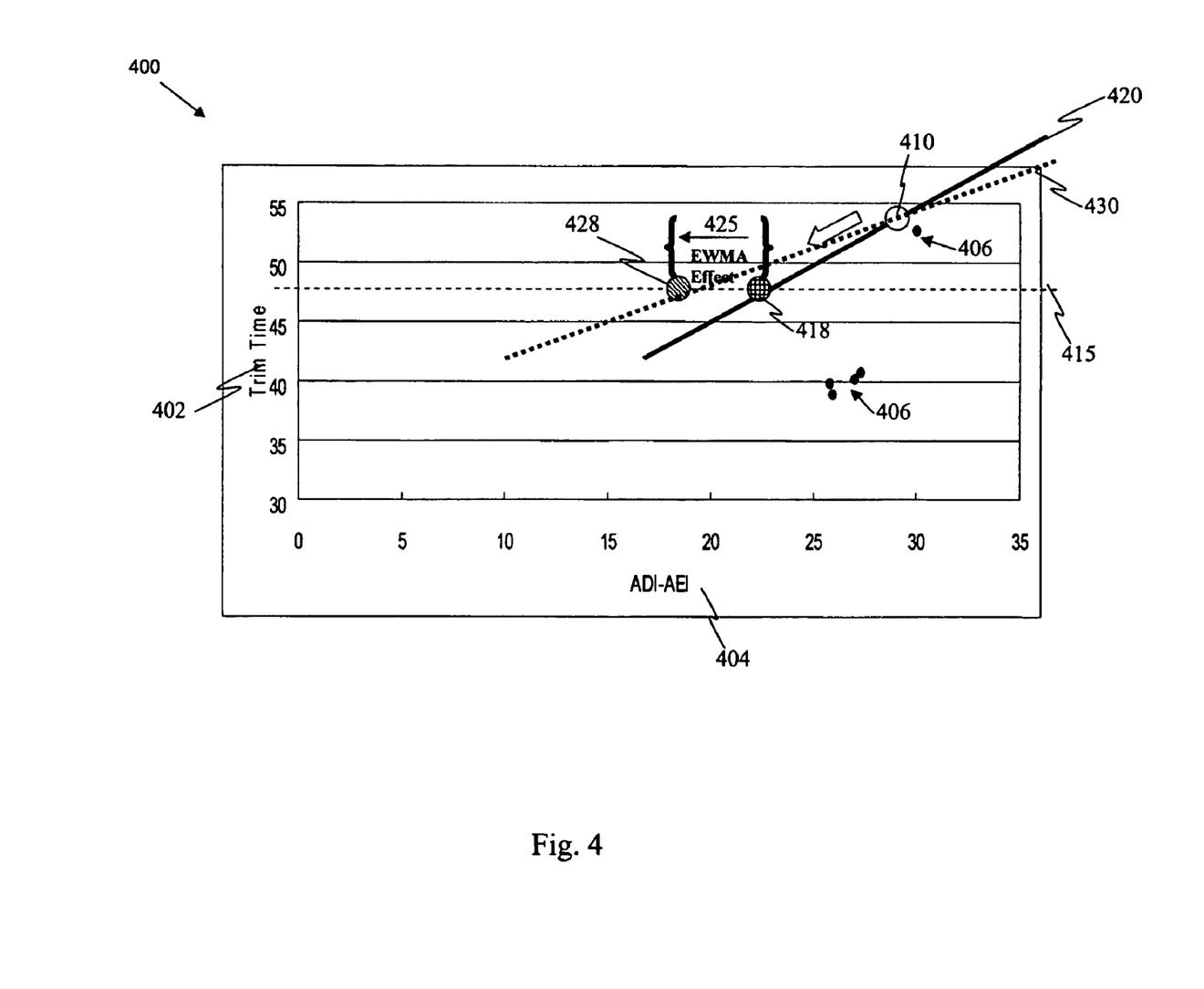
FIG. 4 is a graph illustrating a technique to decouple APC impact on a semiconductor process that can be implemented in the method of FIG. 3.

Referring also to FIG. 4, illustrated is a graph 400 depicting a method for decoupling an APC effect or impact of an etching process discussed above with reference to equations (4)-(6). The graph 400 shows a relationship between a trim time in seconds 402 and a CD Bias in nanometers 404. The trim time 402 represents how long a wafer is etched in the etching process. The CD Bias 404 represents a process result of the etching process. The CD Bias 404 is the trimmed line width and is calculated by (ADI−AEI). The graph 400 depicts various wafer data 406 measured from the etching process. A CD Bias (ADI−AEI) obtained with APC is shown at point 410. A reference trim time is shown by line 415 as a constant trim time setting. An estimated CD Bias 418 is determined from the reference trim time 415 and a line 420 which has a slope equal to 1/trim rate. Accordingly, the APC effect (e.g., EWMA effect) 425 can be eliminated to determine a decoupled APC CD Bias 428. The decoupled APC CD Bias 428 represents the adjusted CD Bias of equation (6) which is equal to ADI−AEI'. A slope of line 430 is modified (as compared to the slope of line 420) due to the EWMA effect.

Figure 5A:
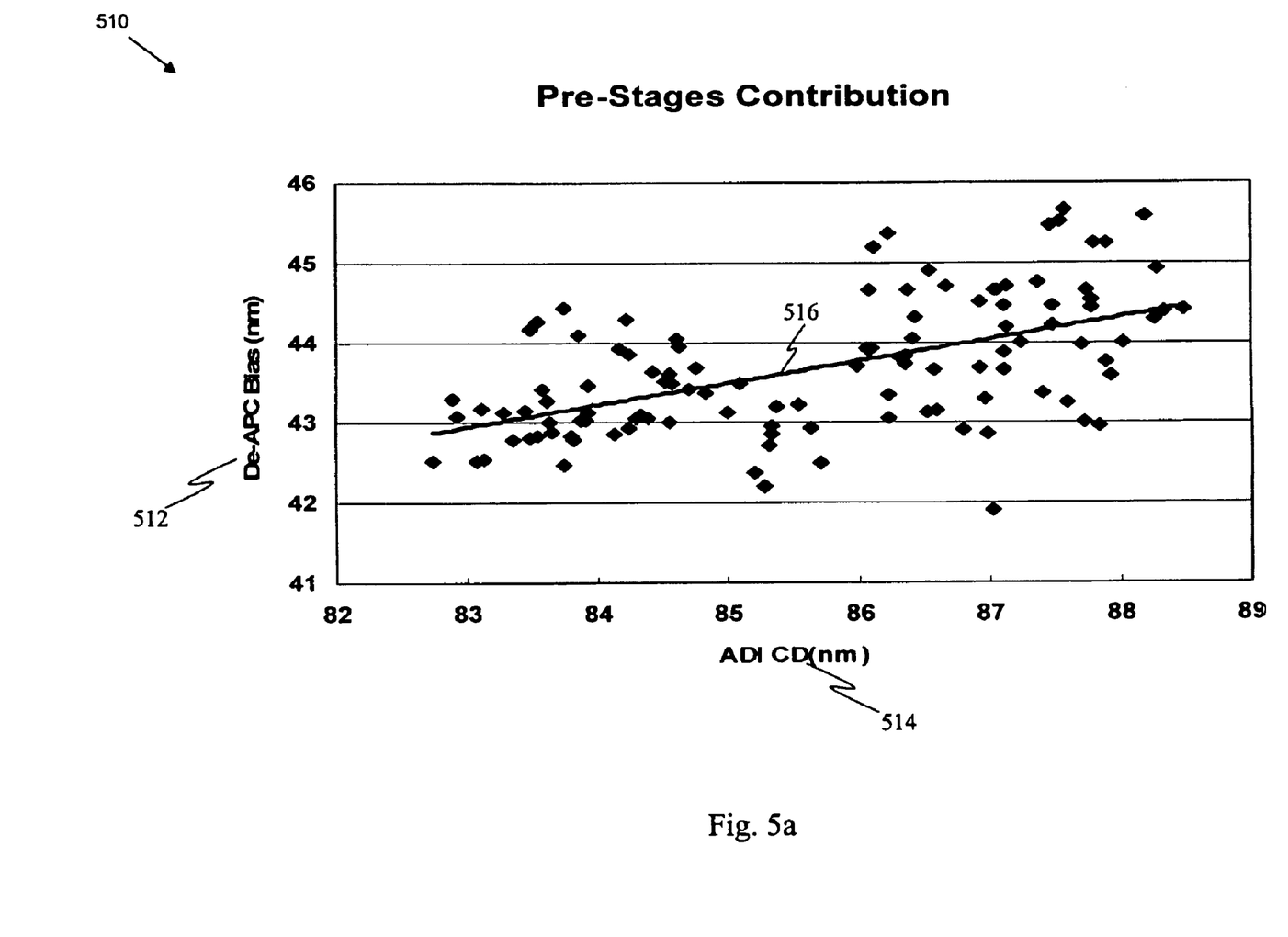
FIGS. 5a and 5b are graphs illustrating a technique to remove pre-stage effects on a semiconductor process that can be implemented in the method of FIG. 3.
Figure 5B:
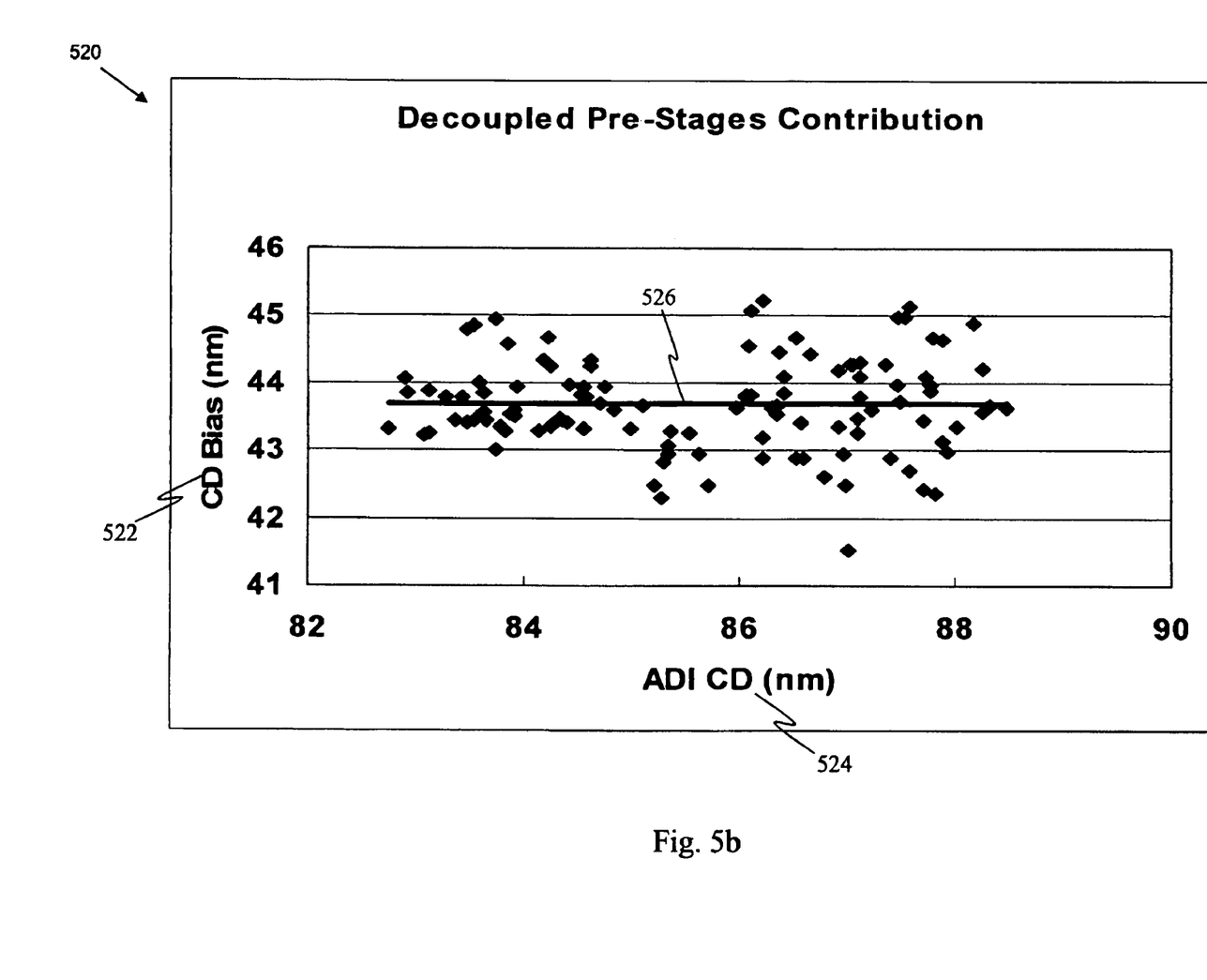

Referring to FIGS. 5a and 5b, illustrated are graphs depicting a method for decoupling pre-stage effects of a poly-etching process discussed above with reference to equation (7). In graph 510, illustrated is a pre-stage noise contribution of the poly-etching process. The pre-stage noise of the poly-etching process includes ADI CD information following the photolithography patterning process as discussed above with reference to FIGS. 1 and 2. The graph 510 depicts a decoupled APC CD Bias in nanometers 512 and a ADI CD in nanometers 514. The decoupled APC CD Bias 512 of various wafers have been determined as discussed above with reference to graph 400 of FIG. 4. The ADI CD 514 of the various wafers are then plotted with respect to the decoupled APC CD Bias to evaluate the pre-stage noise contribution of the poly-etching process. From the wafer data, a line 516 is determined. Accordingly, the slope of the line 516 shows the extent of which the ADI CD contributes noise to the poly-etching process.

In graph 520, illustrated is a decoupling of the pre-stage noise contribution of the poly-etching process. The graph 520 includes a CD Bias in nanometers 522 and a ADI CD in nanometers 524. The CD Bias 522 is determined for various wafers in accordance with eliminating the pre-stage effect (e.g., ADI CD measurement) of the poly-etching process as expressed in equation (7). The ADI CD 524 of the various wafers are then plotted with respect to the CD Bias 522. From the wafer data, a line 526 is determined. Accordingly, the line 526 is substantially horizontal which indicates that the pre-stage effect (ADI CD measurement) has been substantially eliminated from the resulting data (e.g., trimmed line width or CD Bias) of the poly-etching process.

Figure 6:
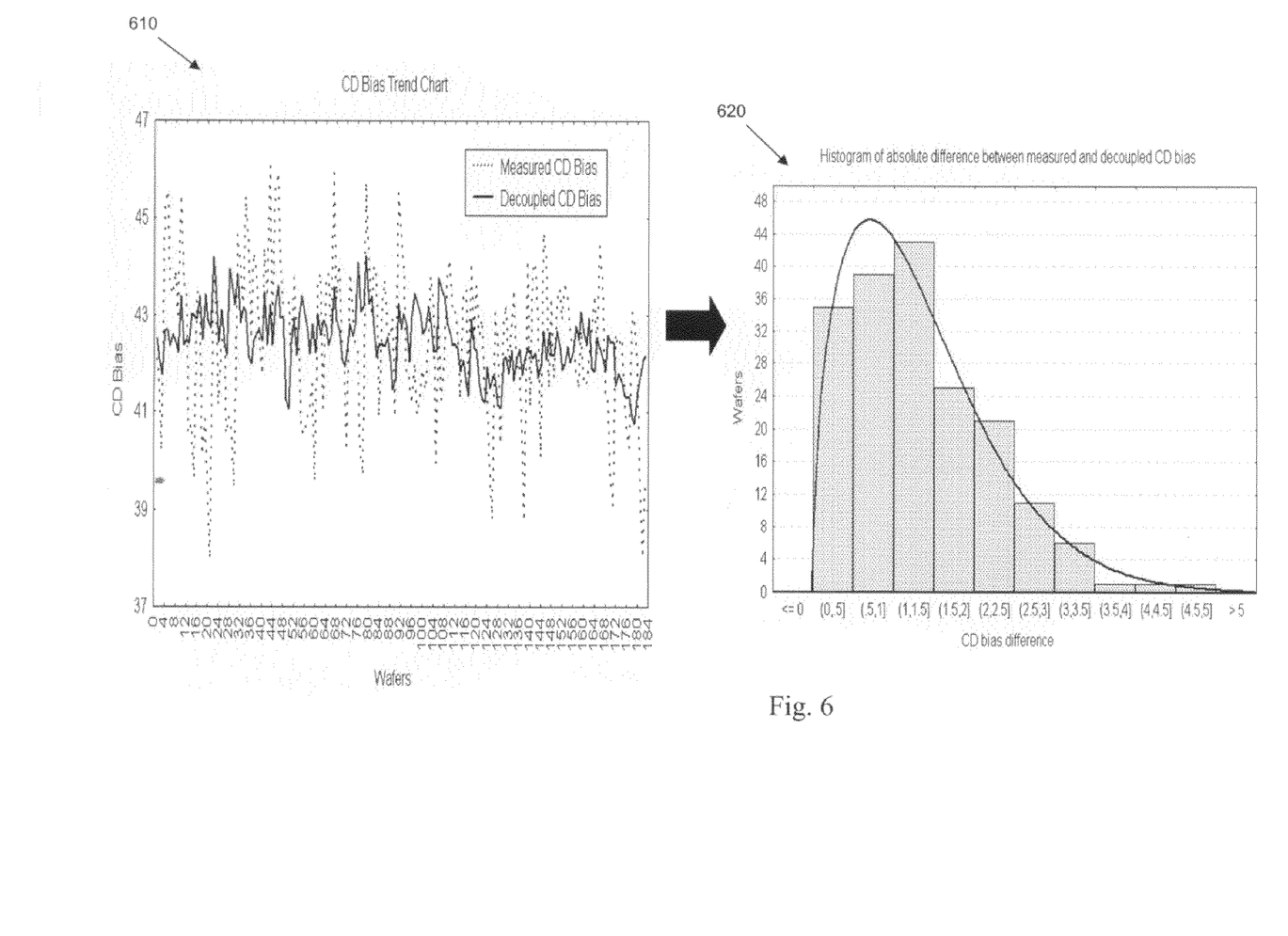
FIG. 6 is graph illustrating a technique to determine a control profile distribution of a semiconductor process that can be implemented in the method of FIG. 3.

Referring back to FIG. 3, the method 300 continues with block 330 in which a control profile distribution is evaluated. An APC output (e.g., trimmed line width or CD Bias) can be described as a systematic distribution with an absolute difference (CD Bias difference) between a real output and a decoupled noise output. Accordingly, an example of the control profile distribution of the etching process is shown in FIG. 6. Referring also to FIG. 6, illustrated in graph 610 is a real output of the CD Bias (Measured CD Bias) of various wafers and a decoupled noise output of the CD Bias (Decoupled CD Bias) of those various wafers. The Decoupled CD Bias data was determined and estimated in accordance with the techniques discussed above with reference to block 320 of FIG. 3 and illustrated with reference to the graphs of FIGS. 4-5. A graph 620 is a histogram depicting the control profile distribution of the poly-etching process by calculating the absolute difference of the real output of the CD Bias (Measured CD Bias) and the decoupled noise output of the CD Bias (Decoupled CD Bias) of graph 610.

Figure 7A:
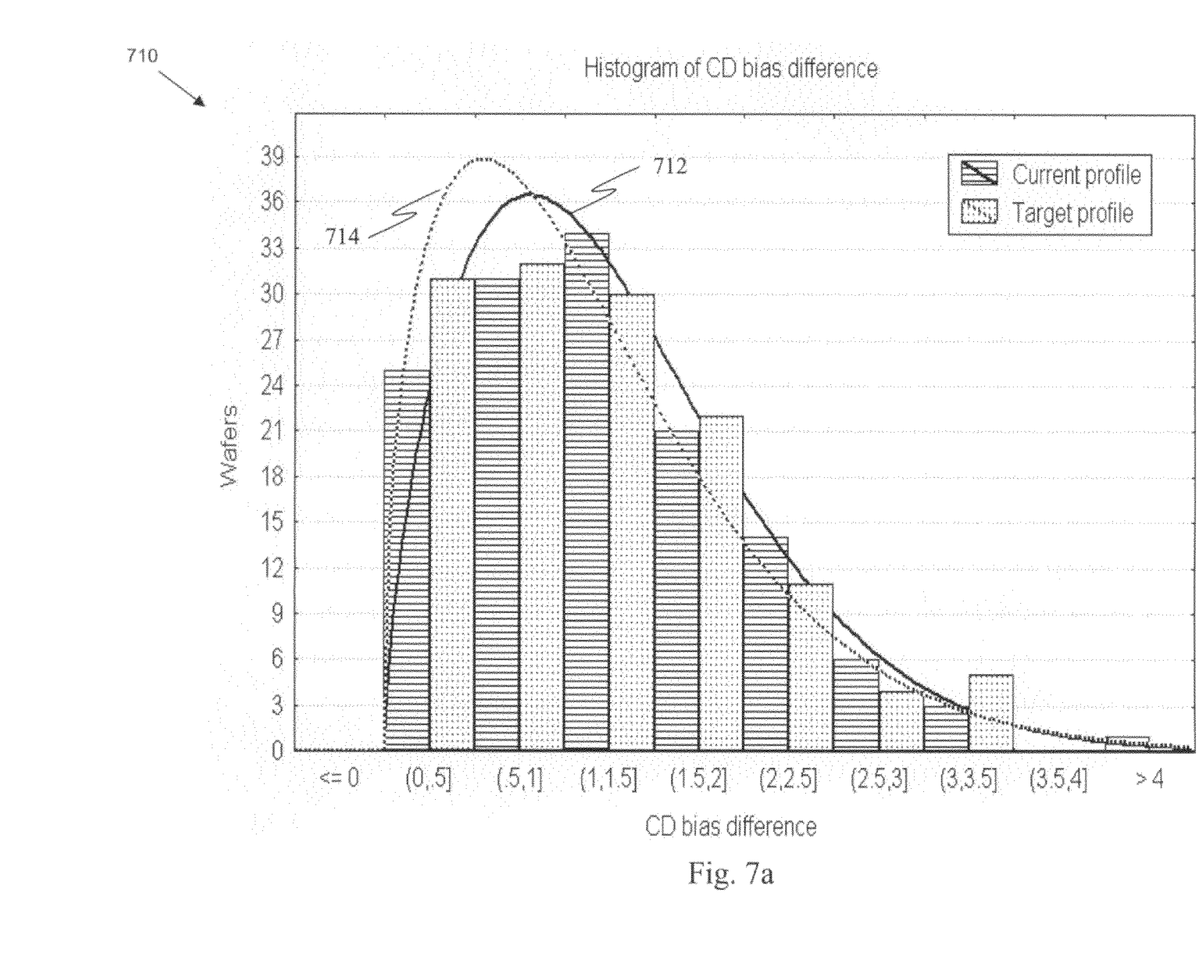
FIGS. 7a and 7b are graphs illustrating a technique to quantify APC performance of a semiconductor process that can be implemented in the method of FIG. 3.
Figure 7B:
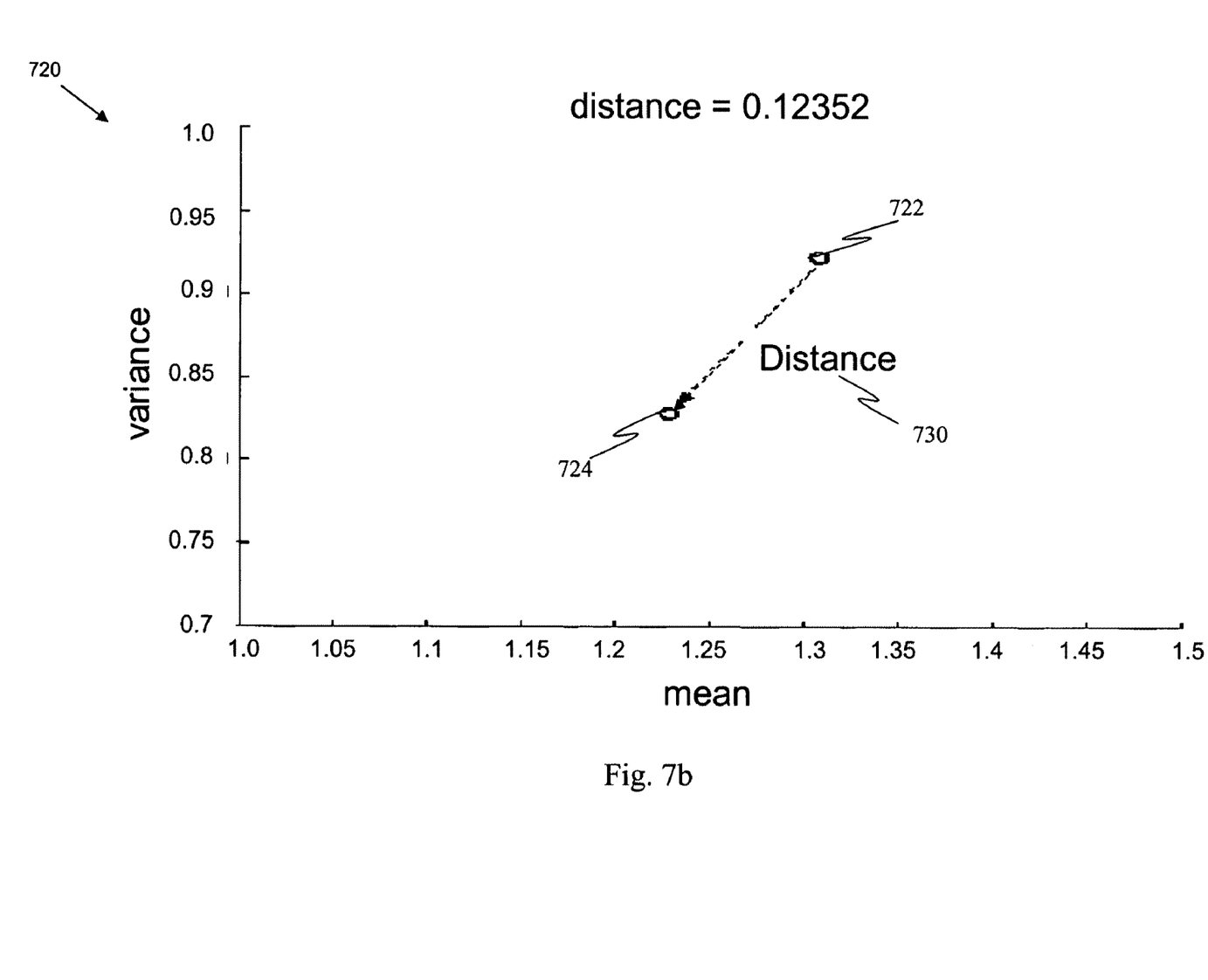

The method 300 continues with block 340 in which a control performance is calculated. The APC control performance of the poly-etching process can be calculated by evaluating how far off a control profile distribution (with decoupling chamber and pre-stage effects on the etching process) is from a target control profile distribution of the poly-etching process. Referring also to FIGS. 7a and 7b, illustrated is a graph 710 depicting the control profile distribution 712 as determined in graph 620 of FIG. 6 and the target control profile 714 of the poly-etching process. The target control profile distribution 714 can be calculated with an absolute difference between a decoupled noise output of the CD Bias of various wafers and a target/desired output of the CD Bias of those various wafers. A graph 720 shows a relationship between a variance and mean of the control profile distribution 712 and the target control profile distribution 714. That is, the control profile distribution 712 and the target control profile distribution 716 can be quantified, for example, as two sets of mean and standard deviation 722, 724, respectively. A distance (e.g., Euclidean distance) 730 between the two sets represents an APC performance index of the poly-etching process. The distance 730 in the present embodiment was calculated to be 0.12352 in the present example. Accordingly, the APC control performance has been quantified without the disturbance of the chamber and pre-stage effects, and thus one can update and tune various process parameters to maximize the APC control performance to achieve a target trimmed line width (e.g., decrease the distance 730).

The method 300 continues with block 350 in which a trim time parameter is determined. In the present embodiment, the APC system implements the control equation (1) to determine a trim time u to be applied to the etching process. The trim time u is calculated for a given target trimmed line width T, an estimated or predicted trim rate a, and the parameter b. The APC parameters can be updated and tuned to account for how far off the APC performance is from achieving the target trimmed line width in previous wafer data.

The method 300 continues with block 360 in which an APC system controls the etching process using the determined trim time. The APC system can implement the trim time determined in block 350 to control the etching process to achieve a real CD bias (ADI–AEI) that is close to the target trimmed line width. The method 300 may continue by looping back to block 310 to repeat the tuning process to provide more updated information regarding the APC control performance of the etching process.

Figure 8:
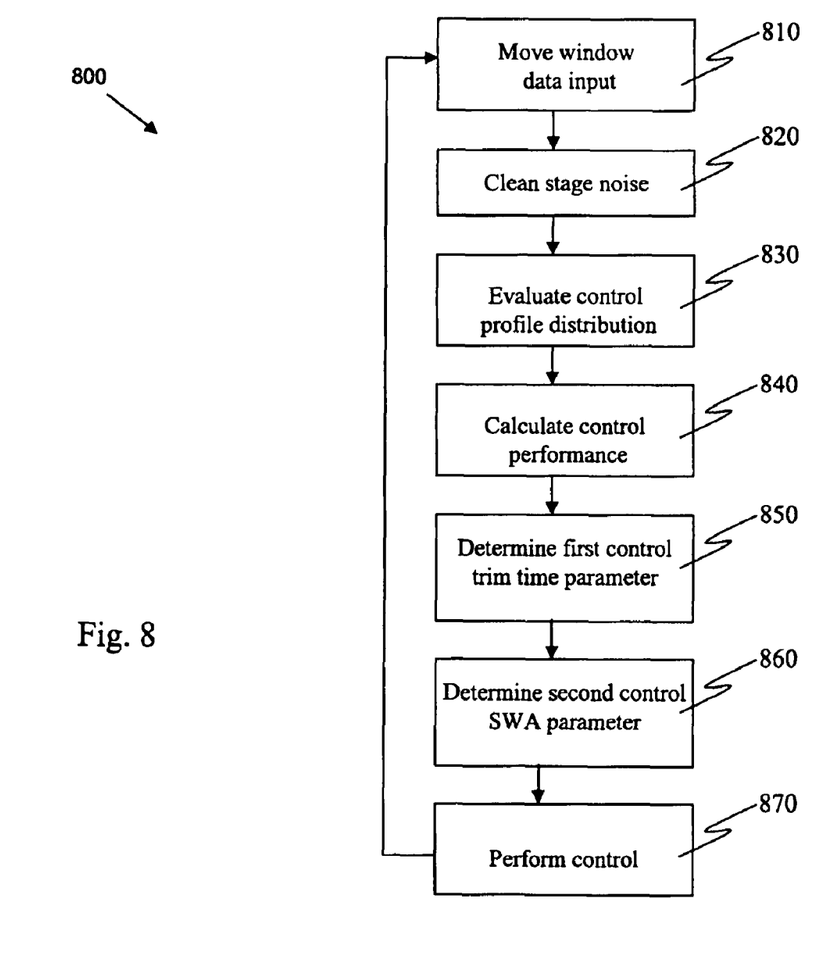
FIG. 8 is a flowchart illustrating another embodiment of a method of tuning APC parameters according to various aspects of the present disclosure.

Referring to FIG. 8, illustrated is flowchart of another method 800 for tuning advanced process control of an etching process. The method 800 is similar to the method 300 of FIG. 3 except that the APC performance is also evaluated and quantified with respect to a second controller parameter of a sidewall angle (SWA) in conjunction with the trim time parameter. The SWA is a measure of an angle of the etch features following the etching process. Blocks 810 through 840 are similar to blocks 310 through 340 of FIG. 3 in which the chamber and pre-stage effects are decoupled from the etching process. Block 850 is similar to block 350 of FIG. 3 in which a first control such as a trim time parameter is determined. It should be noted that the method 300 of FIG. 3 may be seen as implementing control with the SWA parameter of the CD APC set to zero. The method 800 proceeds to identify the SWA effect and remove the SWA effect from the etching process. In order to quantify APC performance with respect to the SWA parameter, a technique similar to the one discussed above may be used. A multiple input multiple output (MIMO) model is implemented to describe the etching process. The MIMO model equation (8) for the etching process can be expressed:

$$y = a \times x_1 + b + c \times x_2 \quad (8)$$
$$= R_{trim} \times T_{trim} + \text{model\_b} + c \times SWA$$

Where y denotes a trimmed line width, $x_1$ denotes a trim time ($T_{trim}$), a denotes a trim rate ($R_{trim}$) (also referred to a TR), b denotes a first constant (referred to a model_b), C denotes a second constant, and $x_2$ denotes a sidewall angle (SWA).

A clean trim rate without noise $R_{trim}'$ is determined by a different trim time and can be expressed in equation (9):

$$R'_{trim} = \frac{\text{model\_b}_n - \text{model\_b}_{n-1}}{\omega_{EWMA} \times T_{trim}} + R_{trim} \quad (9)$$

It should be noted that equation (9) is similar to equation (5).

An adjusted CD Bias is evaluated by the expression in equation (10):

$$y' = y + (T_{r0} - T_{trim}) \times R_{trim}' = ADI - AEI' \quad$$

It should be noted that equation (10) is similar to equation (6).

A SWA effect is then removed. This can be expressed as equation (11):

$$y'' = t' + (SWA - SWA_{mean}) \times K \quad (11)$$

Where K is a slope of a correlation model of the CD Bias and the SWA.

Figure 9:
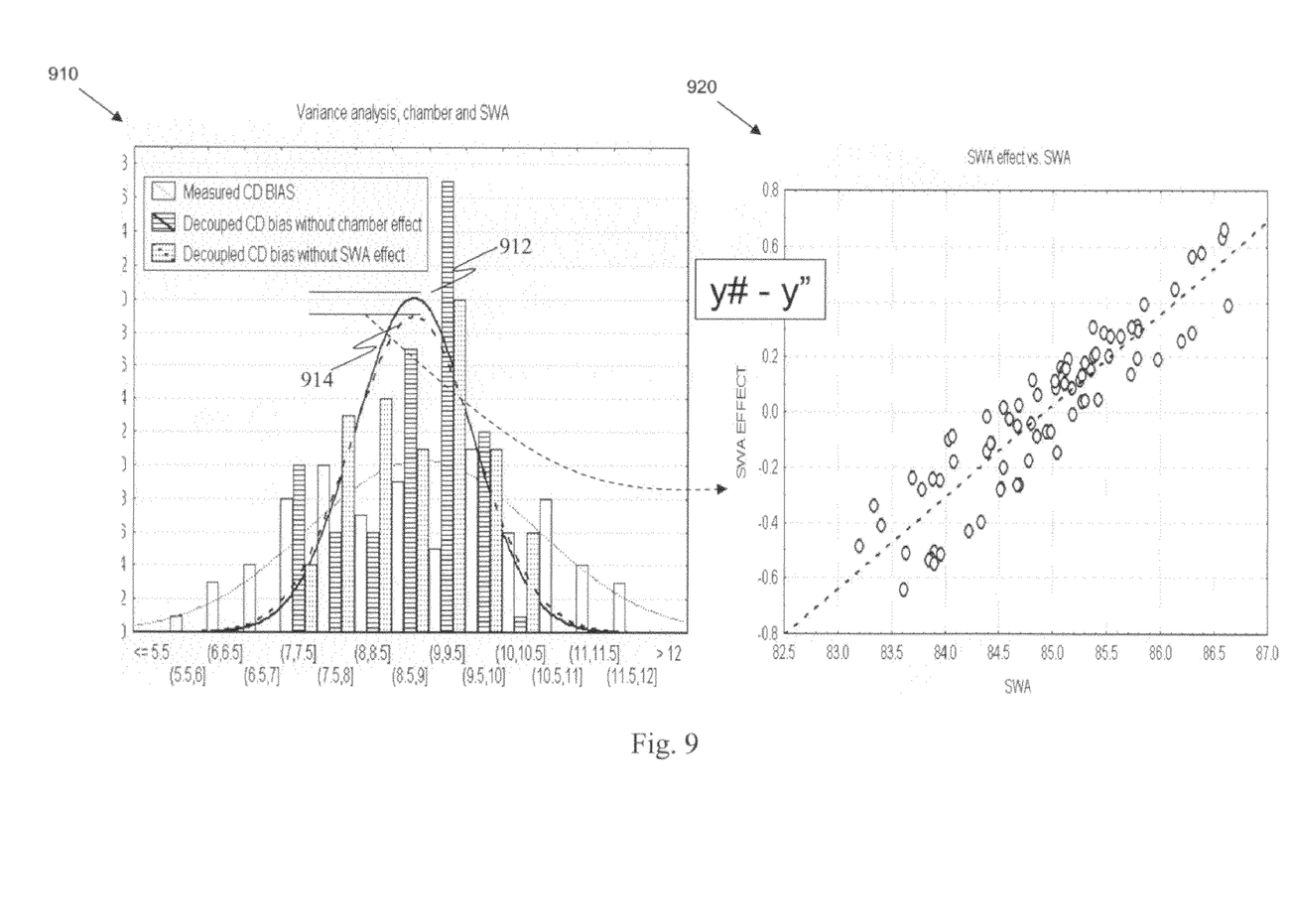
FIG. 9 is a graph illustrating a technique to determine an APC parameter of a semiconductor process that can be implemented in the method of FIG. 8.

The method 800 continues with block 860 in which a second control such as a SWA parameter is determined. The SWA parameter can be retrieved to get an optimal parameter c which is the slope of ($y^\#-y''$) over SWA. $y^\#$ represents equation (7) in which the pre-stage effect is removed and y" represents equation (11) in which the SWA effect is removed. Referring also to FIG. 9, illustrated are graphs depicting a technique to get an optimal parameter c. In graph 910, a variance analysis is performed with respect to the chamber effect and SWA effect of the etching process. The graph 910 includes a histogram depicting a distribution of a measured CD Bias (ADI–AEI), a decoupled noise CD Bias (e.g., $y^\#$), and a decoupled SWA CD Bias (e.g., y"). Additionally, a distribution profile of the decoupled noise CD Bias 912 and the decoupled SWA CD Bias 914 is shown in graph 910. In graph 920, depicted is a relationship between SWA effects on CD Bias in nanometers over SWA in degrees. The slope of line ($y^\#-y''$) shown in graph 920 is determined to be 0.33, and thus the parameter c is set to this value. Accordingly, this value may be set in the MIMO model equation (8) to describe the etching process for APC control.

The method 800 continues with block 870 in which an APC system controls the etching process using the determined trim time parameter and the determined SWA parameter. The APC system can implement the trim time determined in block 850 and the SWA parameter determined in block 860 to control the etching process to achieve optimal APC performance. The method 800 may continue by looping back to block 810 to repeat the tuning process to provide more updated information regarding the APC control performance of the etching process.

Although the embodiment discussed above involves APC control of an etching tool in a semiconductor fabrication process, it would alternatively be possible to use the disclosed technique to control some other aspect of a semiconductor fabrication process, or to control a process in an application other than semiconductor fabrication. Although the disclosed embodiment quantifies APC performance without disturbance from chamber and pre-stage effects to evaluate it with respect to a trim time parameter and SWA parameter, it would alternatively be possible to use the quantified APC performance for other purposes. For example, it would alternatively be possible to quantify the controller's performance on some parameter other than trim time or SWA, relating to some other process result.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

What is claimed is:

1. A method of advanced process control (APC) for semiconductor fabrication, comprising:
    providing a present wafer to be processed by a semiconductor processing tool;
    providing first data of previous wafers that have been processed by the semiconductor processing tool;
    decoupling noise from the first data to generate second data;

evaluating an APC performance based on proximity of the second data to a target data;
determining a control parameter based on the APC performance; and
controlling the semiconductor processing tool with the control parameter to process the present wafer,
wherein the control parameter includes a process time for a process, and
wherein decoupling noise from the first data includes:
 identifying an APC impact on the first data to extract a chamber effect on the process, wherein the chamber effect includes a condition of the processing tool that can influence the process; and
 removing a pre-stage effect on the process, wherein the pre-stage effect includes a pre-stage influencing the process.

2. The method of claim 1, wherein the semiconductor processing tool includes an etching tool, and wherein the control parameter includes a trim time for an etching process.

3. The method of claim 2, wherein
the process is an etching process,
wherein the chamber effect includes a condition of the etching tool that can influence the etching process; and
wherein removing the pre-stage effect on the process includes removing a pre-stage effect on the etching process, wherein the pre-stage effect includes an after-development-inspection of a patterning process.

4. The method of claim 3, wherein an APC algorithm of the etching process is described by:
a model equation expressed as:

$$y = a \times x + b = R_{trim} \times T_{trim} + \text{model\_}b$$

wherein y denotes a trimmed line width, a denotes a trim rate referred to as $R_{trim}$, X denotes a trim time referred to as $T_{trim}$, and b denotes a constant referred to as model_b.
a control equation expressed as:

$$u = T - b/a$$

wherein u denotes a trim time to be applied to the etching process and T denotes a target trimmed line width; and
an exponentially weighed moving average (EWMA) equation expressed as:

$$b_{n+1} = \omega \times (y_n - a \times x_n) + (1 - \omega) \times b_n$$

wherein ω is between 0 and 1, and the EWMA equation is used to update b.

5. The method of claim 4, wherein identifying the APC impact includes:
decoupling the APC impact on the first data by setting a constant trim time, the constant trim time being an average trim time that was implemented to process the previous wafers;
determining a clean trim rate by a trim time different from the average trim time; and
determining an adjusted trimmed line width based on the clean trim rate and a difference between the average trim time and the different trim time.

6. The method of claim 1, wherein evaluating the APC performance includes:
determining a control profile distribution of an absolute difference between a measured trimmed line width of the first data and a decoupled trimmed line width of the second data;
determining a target profile distribution of an absolute difference between the measured trimmed line width of the first data and a target trimmed line width of the target data;
determining a first set of mean and standard deviation of the control profile distribution and a second set of mean and standard deviation of the target profile distribution;
determining a distance between the first set and the second set; and
setting a APC performance index based on the distance.

7. The method of claim 6, wherein determining the control parameter includes determining the control parameter such that the distance between the first set and the second set approaches zero.

8. The method of claim 1, further comprising determining another control parameter based on the APC performance, the another control parameter including a sidewall angle (SWA) parameter.

9. The method of claim 8, wherein decoupling noise from the first data includes:
identifying an APC impact on the first data to extract a chamber effect on the etching process, wherein the chamber effect includes a condition of an etching tool that can influence an etching process;
removing a pre-stage effect on the etching process, wherein the pre-stage effect includes an after-development-inspection of a patterning process; and
removing a SWA effect on the etching process.

10. A method of advanced process control (APC) of an etching process, comprising:
providing data of previous wafers that have undergone the etching process;
removing an APC impact by a first modification of the data, the first modification isolating a chamber effect on the data, the chamber effect including a condition of an etching tool that can influence the etching process;
removing a pre-stage effect by a second modification of the data, the pre-stage effect including an after-development-inspection process;
determining an APC performance based on proximity of the modified data to a target data, the modified data including the first and second modifications of the data;
determining a control parameter for the etching process based the APC performance; and
controlling the etching process with the control parameter to process a present wafer,
wherein determining the APC performance includes:
 determining a control profile distribution of an absolute difference between a measured trimmed line width of the unmodified data and a decoupled trimmed line width of the modified data;
 determining a target profile distribution of an absolute difference between the measured trimmed line width of the unmodified data and a target trimmed line width of the target data;
 determining a first set of mean and standard deviation of the control profile distribution and a second set of mean and standard deviation of the target profile distribution;
 determining a distance between the first set and the second set; and
 setting a APC performance index based on the distance.

11. The method of claim 10, wherein the data includes an after-development-inspection (ADI) critical dimension of a line width prior to the etching process and an after-etch-inspection (AEI) critical dimension of the line width after the etching process.

12. An advanced process control (APC) system for controlling a semiconductor processing tool, comprising:
- memory operable to store first data of previous wafers that have been processed by the semiconductor processing tool; and
- a controller operable to control the semiconductor processing tool based on instructions that:
  - decouple noise from the first data to generate a second data;
  - evaluate an APC performance based on proximity of the second data to a target data; and
  - determine a control parameter based on the APC performance; and
  - control the semiconductor processing tool with the control parameter to process a present wafer,
  - wherein the control parameter includes a trim time for an etching process,
  - wherein the instructions that decouple noise from the first data include instructions that:
    - identify an APC impact on the first data to extract a chamber effect on the etching process, wherein the chamber effect includes a condition of an etching tool that can influence the etching process; and
    - remove a pre-stage effect on the etching process, wherein the pre-stage effect includes an after-development-inspection of a patterning process.

13. The APC system of claim 12, wherein the instructions further include instructions that determine another control parameter based on the APC performance, the another control parameter including a sidewall angle (SWA) parameter; and
- wherein the instructions that decouple noise from the first data further includes instructions that remove a SWA effect on the etching process.

14. The APC system of claim 12, wherein an APC algorithm of the etching process is described by:
- a model equation expressed as:

$$y = a \times x + b = R_{trim} \times T_{trim} + \text{model\_}b$$

wherein y denotes a trimmed line width, a denotes a trim rate referred to as $R_{trim}$, X denotes a trim time referred to as $T_{trim}$, and b denotes a constant referred to as model_b;
- a control equation expressed as:

$$u = \frac{T - b}{a}$$

wherein u denotes a trim time to be applied to the etching process and T denotes a target trimmed line width; and
- an exponentially weighed moving average (EWMA) equation expressed as:

$$b_{n+1} = \omega \times (y_n - a \times x_n) + (1 - \omega) \times b_n$$

wherein $\omega$ is between 0 and 1, and the EWMA equation is used to update b.

15. The APC system of claim 14, wherein the instructions that identify the APC impact includes instructions that:
- decouple the APC impact on the data by setting a constant trim time, the constant trim time being an average trim time that was implemented to process the previous wafers;
- determine a clean trim rate by a trim time different from the average trim time; and
- determine an adjusted trimmed line width based on the clean trim rate and a difference between the average trim time and the different trim time.

16. The APC system of claim 12, wherein the instructions that evaluate the APC performance include instructions that:
- determine a control profile distribution of an absolute difference between a measured trimmed line width of the first data and a decoupled trimmed line width of the second data;
- determine a target profile distribution of an absolute difference between the measured trimmed line width of the first data and a target trimmed line width of the target data;
- determine a first set of mean and standard deviation of the control profile distribution and a second set of mean and standard deviation of the target profile distribution;
- determine a distance between the first set and the second set; and
- setting a APC performance index based on the distance.

17. The system of claim 16, wherein the instructions determine the control parameter includes instructions that determine the control parameter such that the distance between the first set and the second set approaches zero.

* * * * *